United States Patent
Konrath et al.

(10) Patent No.: US 11,158,557 B2
(45) Date of Patent: Oct. 26, 2021

(54) SEMICONDUCTOR DEVICE WITH A PASSIVATION LAYER AND METHOD FOR PRODUCING THEREOF

(71) Applicant: Infineon Technologies AG, Neubiberg (DE)

(72) Inventors: Jens Peter Konrath, Villach (AT); Christian Hecht, Buckenhof (DE); Roland Rupp, Lauf (DE); Andre Kabakow, Grosshelfendorf (DE)

(73) Assignee: Infineon Technologies AG, Neubiberg (DE)

( * ) Notice: Subject to any disclaimer, the term of this patent is extended or adjusted under 35 U.S.C. 154(b) by 2 days.

(21) Appl. No.: 16/394,803

(22) Filed: Apr. 25, 2019

(65) Prior Publication Data

US 2019/0252282 A1    Aug. 15, 2019

Related U.S. Application Data

(63) Continuation of application No. 14/200,732, filed on Mar. 7, 2014, now abandoned.

(51) Int. Cl.
*H01L 23/31*    (2006.01)
*H01L 29/739*   (2006.01)
(Continued)

(52) U.S. Cl.
CPC ...... *H01L 23/3171* (2013.01); *H01L 21/0217* (2013.01); *H01L 21/02126* (2013.01); *H01L 21/02129* (2013.01); *H01L 21/02164* (2013.01); *H01L 21/283* (2013.01); *H01L 21/28247* (2013.01); *H01L 21/3081* (2013.01); *H01L 21/56* (2013.01); *H01L 23/29* (2013.01);
(Continued)

(58) Field of Classification Search
None
See application file for complete search history.

(56) References Cited

U.S. PATENT DOCUMENTS 5,698,894 A   12/1997   Bryant et al.
5,994,762 A   11/1999   Suwanai et al.
(Continued)

FOREIGN PATENT DOCUMENTS

CN    1636271 A    7/2005
CN    101356649 A  1/2009
(Continued)

*Primary Examiner* — Abul Kalam
(74) *Attorney, Agent, or Firm* — Murphy, Bilak & Homiller, PLLC

(57) ABSTRACT

A semiconductor device includes a semiconductor body comprising a first surface and an edge surface, a contact electrode formed on the first surface and comprising an outer edge side, and a passivation layer section conformally covering the outer edge side of the contact electrode. The passivation layer section is a multi-layer stack comprising a first layer, a second layer, and a third layer. Each of the first, second and third layers comprise outer edge sides facing the edge surface and opposite facing inner edge sides. The outer edge side of the contact electrode is disposed laterally between the inner edge sides and the outer edge sides of each layer. The inner and outer edge sides of the third layer are closer to the outer edge side of the electrode than the respective inner and outer edge sides of the first and second layer.

20 Claims, 7 Drawing Sheets

(51) Int. Cl.
  *H01L 29/78*      (2006.01)
  *H01L 29/808*     (2006.01)
  *H01L 29/861*     (2006.01)
  *H01L 29/06*      (2006.01)
  *H01L 29/10*      (2006.01)
  *H01L 21/02*      (2006.01)
  *H01L 21/28*      (2006.01)
  *H01L 21/283*     (2006.01)
  *H01L 21/308*     (2006.01)
  *H01L 21/56*      (2006.01)
  *H01L 23/29*      (2006.01)
  *H01L 27/06*      (2006.01)
  *H01L 29/47*      (2006.01)
  *H01L 29/66*      (2006.01)
  *H01L 29/70*      (2006.01)
  *H01L 29/872*     (2006.01)
  *H01L 29/423*     (2006.01)

(52) U.S. Cl.
  CPC ...... *H01L 23/3192* (2013.01); *H01L 27/0629* (2013.01); *H01L 29/0619* (2013.01); *H01L 29/1066* (2013.01); *H01L 29/47* (2013.01); *H01L 29/66674* (2013.01); *H01L 29/66901* (2013.01); *H01L 29/70* (2013.01); *H01L 29/7397* (2013.01); *H01L 29/7801* (2013.01); *H01L 29/7811* (2013.01); *H01L 29/7813* (2013.01); *H01L 29/808* (2013.01); *H01L 29/8083* (2013.01); *H01L 29/8611* (2013.01); *H01L 29/872* (2013.01); *H01L 29/0615* (2013.01); *H01L 29/0638* (2013.01); *H01L 29/0661* (2013.01); *H01L 29/4236* (2013.01); *H01L 2224/05567* (2013.01); *H01L 2224/05624* (2013.01); *H01L 2224/05647* (2013.01); *H01L 2224/05666* (2013.01); *H01L 2924/1033* (2013.01); *H01L 2924/10272* (2013.01); *H01L 2924/10329* (2013.01); *H01L 2924/10331* (2013.01); *H01L 2924/10335* (2013.01); *H01L 2924/10346* (2013.01); *H01L 2924/10373* (2013.01); *H01L 2924/13055* (2013.01); *H01L 2924/13062* (2013.01); *H01L 2924/13091* (2013.01)

(56)  References Cited

U.S. PATENT DOCUMENTS

| | | | |
|---|---|---|---|
| 6,025,608 | A | 2/2000 | Harris et al. |
| 6,246,076 | B1 | 6/2001 | Lipkin et al. |
| 6,544,904 | B1 | 4/2003 | Kamiura et al. |
| 7,598,576 | B2 | 10/2009 | Ward, III et al. |
| 9,355,958 | B2* | 5/2016 | Schaffer ............ H01L 23/53219 |
| 2005/0277283 | A1* | 12/2005 | Lin ........................ H01L 24/05 438/618 |
| 2006/0220081 | A1 | 10/2006 | Nagai et al. |
| 2007/0001176 | A1 | 1/2007 | Ward et al. |
| 2007/0069347 | A1* | 3/2007 | Lin .................... H01L 23/3192 257/673 |
| 2008/0122086 | A1 | 5/2008 | Tsao et al. |
| 2008/0284009 | A1 | 11/2008 | Min et al. |
| 2008/0286968 | A1 | 11/2008 | Carta et al. |
| 2011/0018128 | A1 | 1/2011 | Wei et al. |
| 2011/0193232 | A1 | 8/2011 | Chen et al. |
| 2012/0032323 | A1 | 2/2012 | Matsumoto et al. |
| 2014/0061670 | A1 | 3/2014 | Wada et al. |
| 2014/0061733 | A1 | 3/2014 | Schmidt et al. |

FOREIGN PATENT DOCUMENTS

| | | |
|---|---|---|
| CN | 101388407 A | 3/2009 |
| CN | 101452950 A | 6/2009 |
| JP | H111121621 A | 4/1999 |
| JP | 2001094056 A | 4/2001 |
| JP | 2007103524 A | 4/2007 |
| JP | 2010153786 A | 7/2010 |
| JP | 2013191632 A | 9/2013 |
| JP | 2013191716 A | 9/2013 |
| JP | 2013239607 A | 11/2013 |
| JP | 2014011342 A | 1/2014 |

* cited by examiner

SEMICONDUCTOR DEVICE WITH A PASSIVATION LAYER AND METHOD FOR PRODUCING THEREOF

RELATED APPLICATIONS

This application is a continuation of and claims priority to U.S. application Ser. No. 14/200,732 filed on Mar. 7, 2014, the content of which is incorporated by reference herein in its entirety.

TECHNICAL FIELD

Embodiments of the present invention relate to a semiconductor device, and in particular relate to a power semiconductor device with a passivation layer.

BACKGROUND

Power semiconductor device such as power diodes or power transistors are capable of blocking high voltages of several 10V, several 100V or even several kilovolts (kV). A high voltage blocking capability is associated with high electric fields in a semiconductor body in which active regions of the semiconductor device are integrated. Surfaces of the semiconductor body where high electric fields occur in a blocking state in particular are very sensitive and require a suitable treatment in order to prevent degradation effects that may result in a reduction of the voltage blocking capability. Such treatment may include the formation of a passivation layer on the surface. However, in under certain circumstances such as, for example, a humid and hot environment, conventional passivation layers may suffer from degradation that may cause corrosion of semiconductor body and/or a metallization contacting the semiconductor body There is a need to provide a semiconductor device with a mechanically and chemically very robust passivation layer.

SUMMARY

A first embodiment relates to a semiconductor device. The semiconductor device includes a semiconductor body having a first surface, a contact electrode on the first surface, and a passivation layer on the first surface adjacent the contact electrode and partially overlapping the contact electrode. The passivation layer includes a layer stack with a first layer including an oxide on the first surface, and a second layer including a nitride on the first layer.

A second embodiment relates to a method. The method includes providing a semiconductor body having a first surface, forming a contact electrode on the first surface, and forming a passivation layer on the first surface adjacent the contact electrode and partially overlapping the contact electrode. The passivation layer includes a layer stack with a first layer including an oxide on the first surface, and a second layer including a nitride on the first layer.

A third embodiment relates to a semiconductor device. The semiconductor device includes a semiconductor body comprising a first surface and an edge surface laterally terminating the first surface, a contact electrode formed on the first surface and comprising an outer edge side that faces and is laterally spaced apart from the edge surface, and a passivation layer section conformally covering the outer edge side of the contact electrode. The passivation layer section is a multi-layer stack comprising a first layer, a second layer, and a third layer, each of the first, second and third layers being formed from different electrically insulating materials. The first layer directly contacts the contact electrode and the first surface. The second layer is formed directly on the first layer. The third layer is formed directly on the second layer. Each of the first, second and third layers comprise outer edge sides facing the edge surface of the semiconductor body and inner edge sides opposite from the outer edge sides. The outer edge side of the contact electrode is disposed laterally between the inner edge sides and the outer edge sides of each of the first, second and third layers. The inner edge side of the third layer is laterally closer to the outer edge side of the electrode than the inner edge side of the second layer. The outer edge side of the third layer is laterally closer to the outer edge side of the electrode than the outer edge side of the second layer.

A fourth embodiment relates to a method. The method includes providing a semiconductor body comprising a first surface and an edge surface laterally terminating the first surface, forming a contact electrode on the first surface that comprises an outer edge side that faces and is laterally spaced apart from the edge surface, and forming a passivation layer section that conformally covers the outer edge side of the contact electrode. The passivation layer section is a multi-layer stack comprising a first layer, a second layer, and a third layer, each of the first, second and third layers being formed from different electrically insulating materials. The first layer directly contacts the contact electrode and the first surface. The second layer is formed directly on the first layer. The third layer is formed directly on the second layer. Each of the first, second and third layers comprise outer edge sides facing the edge surface of the semiconductor body and inner edge sides opposite from the outer edge sides. The outer edge side of the contact electrode is disposed laterally between the inner edge sides and the outer edge sides of each of the first, second and third layers. The inner edge side of the third layer is laterally closer to the outer edge side of the electrode than the inner edge side of the second layer. The outer edge side of the third layer is laterally closer to the outer edge side of the electrode than the outer edge side of the second layer.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION

In the following Detailed Description, reference is made to the accompanying drawings, which form a part thereof, and in which is shown by way of illustration specific embodiments in which the invention may be practiced.

Figure 1:
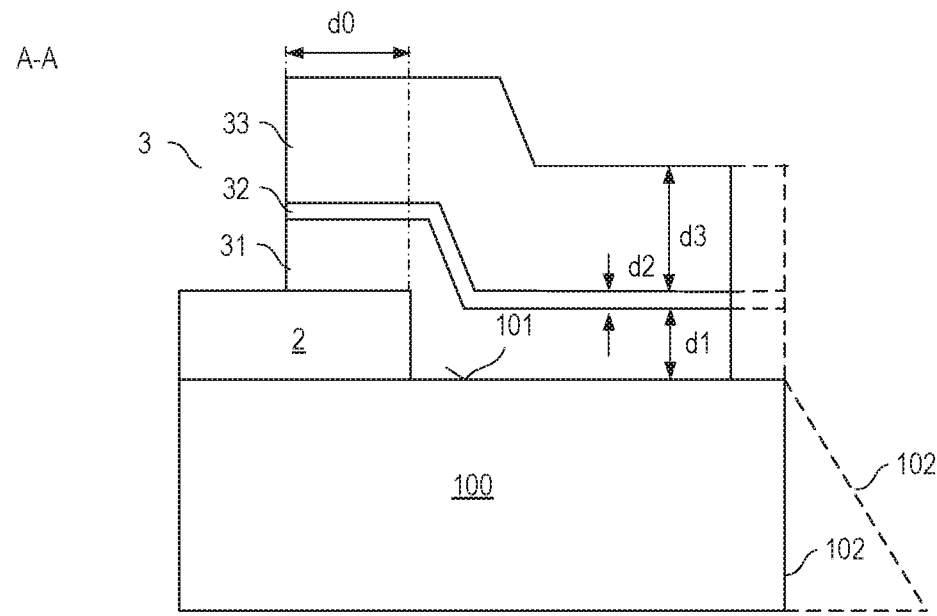
FIG. 1 illustrates a vertical cross sectional view of one embodiment of a semiconductor device including a passivation layer on a first surface of a semiconductor body.
Figure 2:
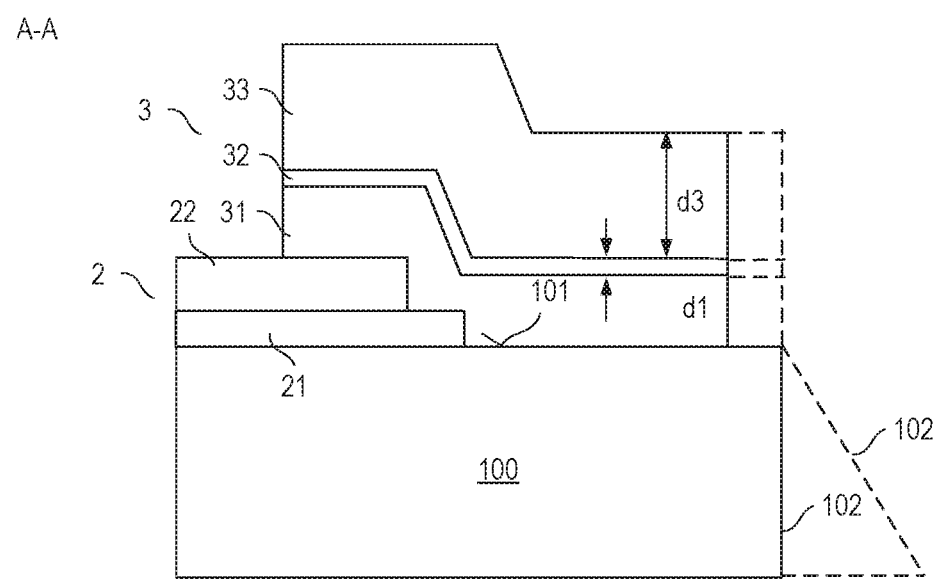
FIG. 2 illustrates a vertical cross sectional view of another embodiment of a semiconductor device including a passivation layer on a first surface of a semiconductor body.

FIGS. 1 and 2 illustrate a vertical cross sectional view of a section of a semiconductor device, such as a power semiconductor device. The semiconductor device includes a semiconductor body 100 with a first surface 101. The semiconductor device further includes a contact electrode 2 on the first surface 101 and adjoining the semiconductor body 100.

According to one embodiment, the contact electrode 21 includes at least one of aluminum, titanium, copper, an aluminum alloy, a copper alloy, an aluminum-copper alloy such as AlCu or AlSiCu. The contact electrode 2 may include one layer, as shown in FIG. 1. According to another embodiment shown in FIG. 2, the contact electrode 2 includes a first sublayer 21 contacting the first surface 101, and a second sublayer on the first sublayer 21. According to one embodiment, the first sublayer 21 is a titanium (Ti) layer and the second sublayer 22 is one of an aluminum layer, copper layer, an aluminum alloy layer, copper alloy layer, and aluminum-copper alloy layer. Referring to FIG. 2, the first sublayer may be implemented with a larger area than the first sublayer 21 so that the first layer 21, below the second layer 22, protrudes beyond the second sublayer 22. The passivation layer 3 overlaps both sublayers 21, 22.

The contact electrode 2 does not completely cover the first surface 101. A passivation layer 3 is formed in those regions of the first surface 101 adjacent the contact electrode 21 and not covered by the contact electrode 21. The passivation layer protects the first surface 101 of the semiconductor body 100 and provides for a long-term stability of the semiconductor device. In particular, the passivation layer 3 prevents, or at least reduces, degradation processes that may occur when a semiconductor device is operated in a humid atmosphere. Those degradation processes may occur, in particular, in those regions of the first surface 101 where high electric fields may occur.

Referring to FIG. 1, the semiconductor body 100 includes an edge surface 102. The edge surface 102 terminates the semiconductor body 100 laterally, which means in directions substantially parallel to the first surface 101. The edge surface can be substantially perpendicular to the first surface 101. However, according to one embodiment (shown in dashed lines in FIG. 1) the edge surface 102 is beveled relative to the vertical direction of the semiconductor body 100 (the vertical direction is a direction substantially perpendicular to the first surface 101).

Referring to FIG. 1, the passivation layer 3 overlaps the contact electrode 2, but does not completely cover the contact electrode 2. According to one embodiment, an overlap d0 is between 100 micrometers ($\mu m$) and 200 micrometers. The "overlap" d0 is the distance the passivation layer 3 overlaps the contact electrode in a direction facing away from an outer edge of the contact electrode 2. In those regions of the contact electrode 2 that are not covered by the passivation layer 3 the contact electrode can be contacted by bond wires (not shown) or the like.

The basic device structure illustrated in FIG. 1 with a semiconductor body 100, a contact electrode 2 on the first surface 101 of the semiconductor body 100, and a passivation layer 3 can be implemented in different semiconductor devices and is not restricted to one specific type of semiconductor device. Thus, in FIG. 1 only the semiconductor body 100, but not specific device regions implemented in the semiconductor body 100 are illustrated. Some embodiments of specific semiconductor devices and of specific device structures in the semiconductor body 100 are explained with reference to FIGS. 6-8 below.

Referring to FIG. 1, the passivation layer 3 includes a layer stack. The layer stack includes a first layer 31 including an oxide on the first surface, and a second layer 32 including a nitride on the first layer. According to one embodiment, the layer stack further includes a third layer 33 including an imide in the second layer.

According to one embodiment, a thickness d1 of the first layer 31 on the first surface 101 is at least 1.5 micrometers ($\mu m$) or at least 2.7 micrometers. According to one embodiment, a maximum thickness of the first layer 31 on the first surface is 3.5 micrometers. A thickness of the first layer 31 in those regions where it overlaps the contact electrode 2 may substantially correspond to the thickness above the first surface 101.

According to one embodiment, a thickness d2 of the second layer 32 is at least 0.6 micrometers ($\mu m$) or at least 0.8 micrometers. According to one embodiment, a maximum thickness of the second layer 32 is 1 micrometer. The thickness of the second layer 32 in those regions where it overlaps the contact electrode 2 may substantially correspond to the thickness in those regions where it does not overlap the contact electrode.

According to one embodiment, a thickness d3 of the third layer 33 is at least 7 micrometers ($\mu m$), 8 micrometers, 20 micrometers, or 30 micrometers. According to one embodiment, a maximum thickness of the third layer 33 is 50 micrometers. The thickness of the third layer 33 in those regions where it overlaps the contact electrode 2 may substantially correspond to the thickness in those regions where it does not overlap the contact electrode.

The semiconductor body 100 may include a conventional semiconductor material such as a group IV semiconductor, a IV-IV semiconductors, a III-V semiconductor, or a II-VI semiconductor. Examples of a group IV semiconductor include silicon (Si) and germanium (Ge). Examples of a IV-IV semiconductor include silicon carbide (SiC), and silicon germanium (SiGe). Examples of a III-V semiconductor include gallium arsenide (GaAs), gallium nitride (GaN), gallium phosphide (GaP), indium phosphide (InP), indium gallium nitride (InGaN), and indium gallium arsenide (InGaAs). Examples of a II-VI semiconductor include cadmium telluride (CdTe), cadmium mercury telluride (CdHgTe), and cadmium magnesium telluride (CdMgTe). According to one embodiment, the oxide in the first layer 31 is silicon oxide (silicon dioxide, $SiO_2$) and the nitride in the second layer 32 is silicon nitride ($Si_3N_4$). This choice of the oxide and the nitride may be independent of the specific type of semiconductor material of the semiconductor body 100.

The first layer 31 may include two or more sublayers with each sublayer including an oxide. According to one embodiment, the first layer includes at least one of the following oxide layers, an un-doped silicate glass (USG), a phosphorous doped silicate glass (PSG), a boron doped silicate glass (BSG), or a boron and phosphorous doped silicate glass (BPSG). According to one embodiment, the first layer 31 includes only one of these glasses. According to another embodiment, first layer 31 includes two or more sublayer with different oxides. According to one embodiment, the first layer 31 is a deposited layer such as a PECVD (Plasma Enhanced Chemical Vapor Deposition) layer. According to another embodiment, the first layer 31 is a sputtered layer, which is a layer formed in a sputter process.

In the lateral direction, the passivation layer 3 may end distant to the edge surface 102 (as shown in FIG. 1). However, according to one embodiment (shown in dashed lines in FIG. 1) the passivation layer 3 in the lateral direction extends to the edge surface 102.

According to one embodiment, the second layer 32 is a PECVD silicon nitride layer. According to another embodiment, the second layer 32 is a sputtered layer.

Referring to FIGS. 1 and 2, the passivation layer 3 may leave sections of the first surface 101 uncovered. For example, in a semiconductor body in which a power semiconductor device and low-voltage semiconductor devices are integrated, the passivation layer may not cover those regions of the first surface 101 below which the low-voltage devices are integrated. However, this is only an example. According to a further embodiment (illustrated in dashed lines in FIGS. 1 and 2) the passivation layer 3 completely covers the first surface 101 on the semiconductor body 100 between the contact electrode 2 and the edge surface 102 of the semiconductor body 100.

Figure 3:
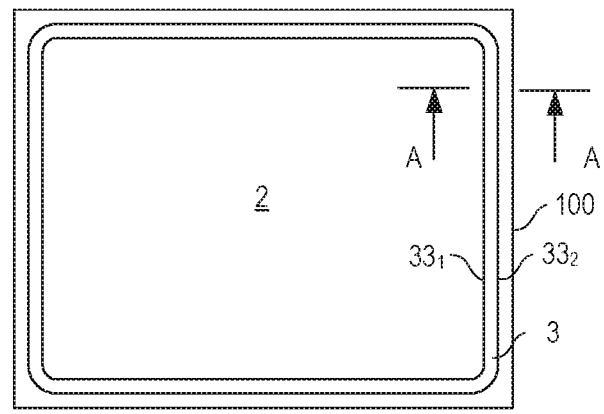
FIG. 3 shows a top-down view of one embodiment of a semiconductor device including a passivation layer on a first surface of a semiconductor body.

However, in each of these embodiments, the passivation layer 3 may completely surround the contact electrode 21 on the first surface 101. This is shown in FIG. 3, which illustrates a top view of the complete semiconductor body 100 (whereas FIGS. 1 and 2 only show one section of the semiconductor body 100 close to the edge surface 102).

Figure 4:
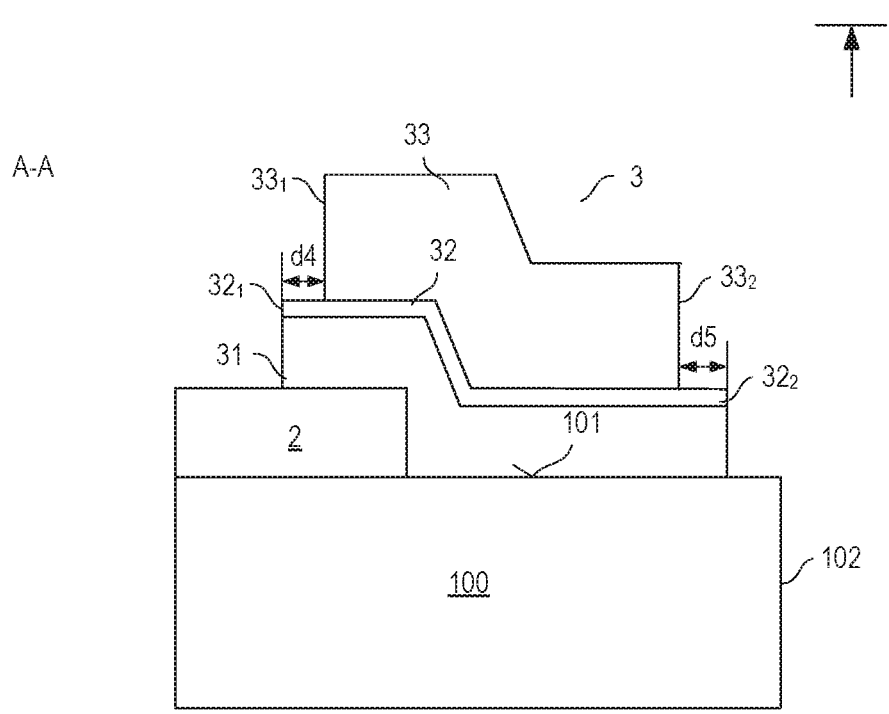
FIG. 4 illustrates a vertical cross sectional view of another embodiment of a semiconductor device including a passivation layer on a first surface of a semiconductor body.

FIG. 4 shows a vertical cross sectional view of one section of a semiconductor device according to another embodiment. In the embodiments shown in FIGS. 1 and 2 edges of the first layer 31, the second layer 32, and the third layer 33 are substantially aligned. In the embodiment shown in FIG. 4, edges $33_1$, $33_2$ of the third layer 33 are distant to edges $32_1$, $32_2$ of the second layer 32. The edges of the first layer 31 and the second layer 32 are substantially aligned in this embodiment.

In FIG. 4, reference characters $32_1$, $33_1$ denote inner edges of the second layer 32 and the third layer 33, respectively, which are edges facing the contact electrode 2, and reference characters $32_2$, $33_2$ denote outer edges of the second layer 32 and the third layer 33, respectively, which are edges facing away from the contact electrode 2. Referring to FIG. 4, the inner edge $33_1$ of the third layer 33 is distant to the inner edge $32_1$ of the second layer 32 such that the second layer 32 in the direction of the contact electrode 2 protrudes beyond the second layer 32. That is, the third layer 33 does not cover sections of the second layer 32 between the inner edge $32_1$ of the second layer 32 and the inner edge $33_1$ of the third layer 33. Further, the outer edge $33_2$ of the third layer 33 is distant to the outer edge $32_2$ of the second layer 32 such that the second layer 32 in the direction of edge surface 102 protrudes beyond the second layer 32. That is, the third layer 33 does not cover sections of the second layer 32 between the outer edge $32_2$ of the second layer 32 and the outer edge $33_2$ of the third layer 33. A distance d4 between the inner edge $32_1$ of the second layer 32 and the inner edge $33_1$ of the third layer 33 is, for example, between 20 micrometers (μm) and 40 micrometers. A distance d5 between the outer edge $32_2$ of the second layer 32 and the outer edge $33_2$ of the third layer 33 is, for example, between 20 micrometers (μm) and 40 micrometers.

Although in the embodiment shown in FIG. 4, there is a distance between the inner edges $32_1$, $33_1$ and the outer edges $32_2$, $33_2$ of the second layer 32 and the third layer 33, this is only an example. According to another embodiment, there is a distance only between one of the inner edges $32_1$, $33_1$ and the outer edges $32_2$, $33_2$ of the second layer 32 and the third layer 33.

In the passivation layer 3, the oxide including first layer 31 and the nitride including second layer 32 act as humidity barriers that protect those regions of the first surface 101 and the contact electrode 2 that are covered by the passivation layer from humidity and corrosion. Corrosion of the contact electrode 2 and/or the semiconductor body 100 may be caused by mobile ions travelling along the edges of the third, second, and first layer 33, 32, 32 to the contact electrode 2 and the first surface 101, respectively. In the embodiment shown in FIG. 4 in which there is a distance between the edges of the second layer 32 and the third layers 33 there is a longer distance for those mobile ions that may travel along the surface of the third layer 33 from the third layer to the contact electrode 2 and the first surface 101, respectively. This longer distance may additionally improve the corrosion protection.

Figure 5:
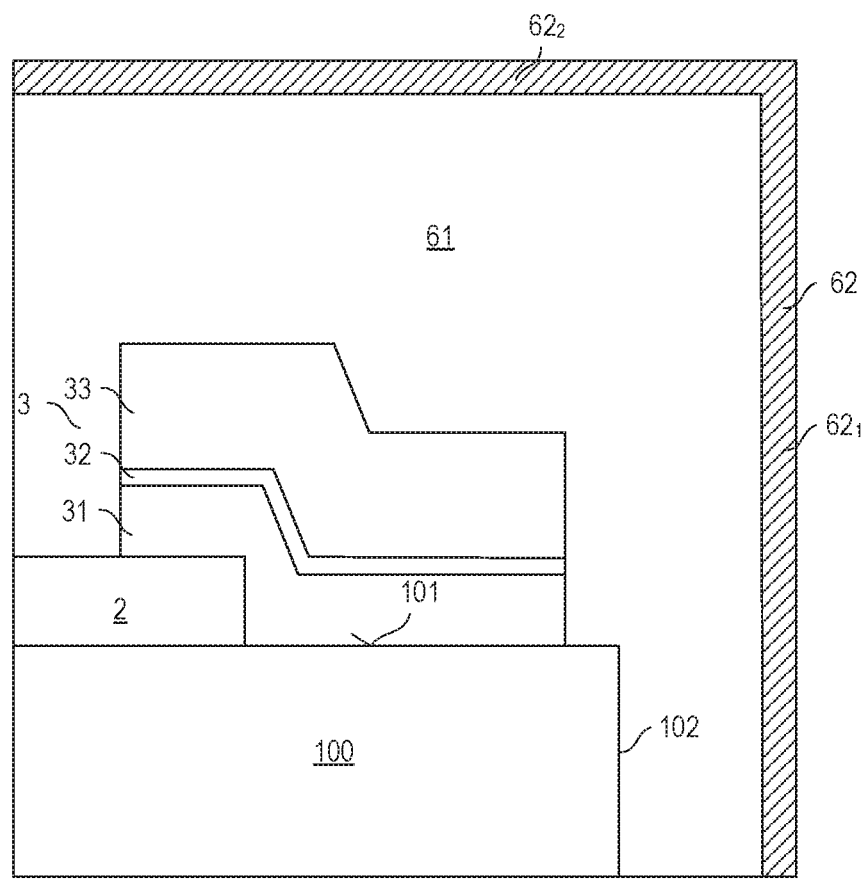
FIG. 5 illustrates a vertical cross sectional view of one embodiment of a semiconductor device including a passivation layer on a first surface of a semiconductor body, a soft encapsulation layer, and a housing.

Referring to FIG. 5, the semiconductor device may additionally include a soft encapsulation layer 61 and a housing 62. In FIG. 5, only a section of the soft encapsulation layer 61 and the housing are shown. The soft encapsulation layer 61 fills a space between the semiconductor 100 with the contact electrode 2 and the passivation layer 3 and the housing 62. The housing may include openings through which contact pins (not shown in FIG. 5) extend from outside the housing to inside the housing. Those contact pins allow the semiconductor device to be contacted from externally, that is, from outside the housing. The soft encapsulation layer 61 includes, for example, silicone or a silica gel.

The housing may include a bottom, sidewalls $62_1$ and a cover $62_2$, wherein in FIG. 5 only a section of one sidewall $62_1$ and a section of the cover $62_2$ are shown. The bottom (not shown) may include a substrate such as, for example, a DCB (Direct Copper Bonding) substrate or a PCB (Printed Circuit Board). The sidewalls $62_1$ and the cover $62_2$ may include an electrically insulating plastic material. The sidewalls sidewall $62_1$ and the cover $62_2$ can be implemented as two separate parts. This allows the semiconductor body 100 to be packed in the housing 62 as follows. First, an open housing 62 is provided, that is a housing without cover. Then, the semiconductor body 100 is inserted in the housing, the open housing is filled is with the soft encapsulation layer 61, and the housing is closed by mounting the cover $62_2$ on top of the sidewalls $62_1$.

Figure 6:
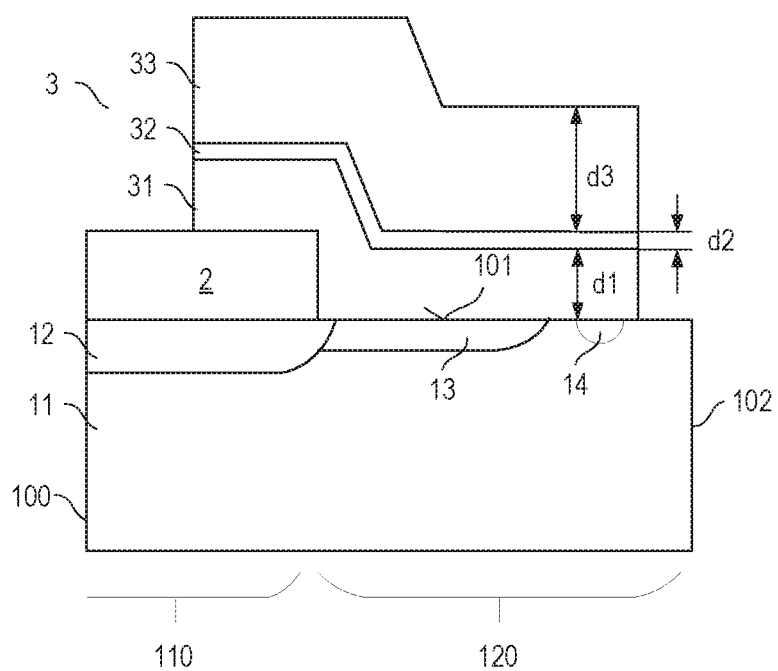
FIG. 6 illustrates a vertical cross sectional view of a semiconductor device including a pn-junction.

The topology explained above with the semiconductor body 100, the contact electrode 2, and the passivation layer 3 may be used in a plurality of different semiconductor devices. FIG. 6 illustrates a vertical cross sectional view of a semiconductor device that has the topology explained with reference to FIG. 1 (although one of the topologies explained with reference to FIGS. 2 and 4 may be used as well) and includes a pn junction in the semiconductor body 100. The pn junction is formed between a doped first device region 11 of a first doping type and a doped second device region 12 of a second doping type complementary to the first doping type. The second device region 12 is electrically connected to the contact electrode 2. The first device region 11 may extend to the edge surface 102. Further, below the passivation layer 3, the first device region 11 may extend to the first surface 101. The region of the semiconductor body 100 in which the pn junction is formed can be referred to as inner region 110, and the region adjoining the inner region 110 can be referred to as outer region or edge region 120. The edge region 120 may extend from the inner region 110 to the edge surface 102 of the semiconductor body 100. However, this is only an example. According to a further embodiment (not illustrated), further semiconductor regions may adjoin the edge region 120, such as semiconductor regions in which low-voltage semiconductor devices or logic devices are implemented.

Referring to FIG. 6, the pn junction may extend to the surface 101 and be covered by the passivation layer 3. That is, an edge surface of the contact electrode 2 is distant to the position where the pn junction extends to the first surface 101.

Optionally, the semiconductor device includes an edge termination structure in the edge region 120 below the passivation layer 3. The edge termination structure may include a JTE (Junction Termination Extension) region 13 (as shown) of the second doping type. Additionally, the edge termination structure may include a channel stopper region 14 of the first doping type and more highly doped than the first device region 11. The JTE region 13 and the channel stopper region 14 both adjoin the first surface 101 and are distant in the horizontal (lateral) direction of the semiconductor body 100. According to one embodiment, the passivation layer 3 covers the complete edge termination structure. That is, in the embodiment shown in FIG. 6, the passivation layer 3 covers the JTE region 13 and the channel stopper region 14. Other types of edge termination structures may be used additionally or instead the JTE region 13 such as, for example, edge termination structures including field rings and/or field plates.

The semiconductor device shown in FIG. 6 as well as the semiconductor devices explained below may include a soft encapsulation layer 61 and a housing as explained with reference to FIG. 5. However, this is not shown in FIG. 6 and the following figures.

The passivation layer 3 explained before is suitable to be used in high voltage semiconductor devices, such as semiconductor devices with a voltage blocking capability of several 100V, or several kilovolts (kV). The passivation layer 3 is, in particular, suitable to be used in semiconductor devices with a voltage blocking capability of 1 kV and more.

The device topology shown in FIG. 6 with the semiconductor body 100, a contact electrode 2 contacting one 12 of the device regions 11, 12, and a passivation layer 3 can be used in different semiconductor devices. Four possible embodiments are explained below with reference to FIGS. 7-10.

Figure 7:
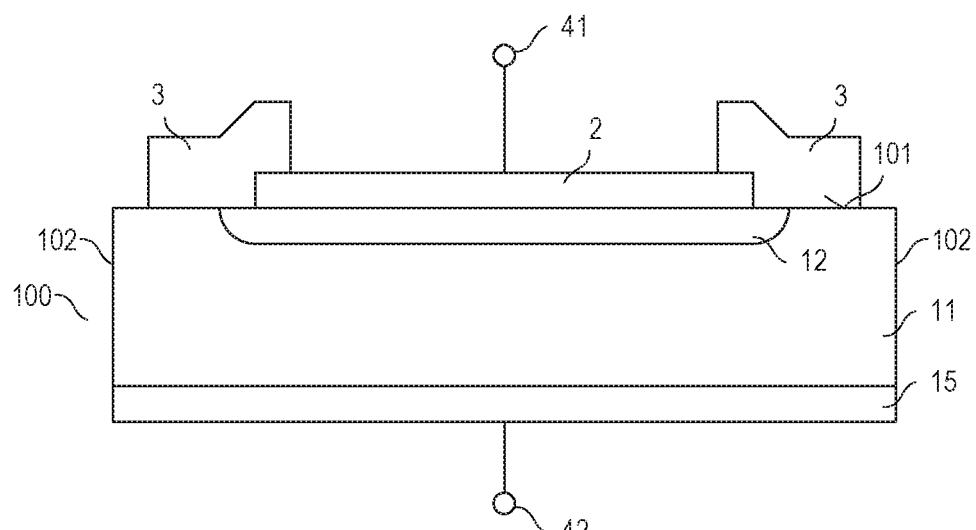
FIG. 7 illustrates a vertical cross sectional view of a semiconductor device implemented as a bipolar diode.

Referring to FIG. 7, the semiconductor device may be implemented as a bipolar diode, in particular as a power diode. FIG. 7 illustrates a vertical cross sectional view of a power diode having a device topology as explained with reference to FIG. 6. However, the passivation layer 3 is not illustrated in detail (that is the individual layers of the layer stack are not shown) and the optional edge termination structure is not illustrated. The passivation layer 3 may be implemented in accordance with one of the embodiments explained herein before.

In the diode shown in FIG. 7, the first device region 11 forms a base region of the diode and the second device region 12 forms a first emitter, which is one of an n-emitter and a p-emitter of the diode. According to one embodiment, the base region 11 is n-doped, so that the second device region 12 is p-doped and forms a p-emitter (anode) of the diode. The diode further includes a second emitter region 15 of the first doping type, more highly doped than the base region 11, and adjoining the base region 11. The contact electrode 21 is electrically (ohmically) connected to the first emitter 12 and to a first terminal 41 of the diode. The first terminal 41 forms an anode terminal if the first emitter is a p-emitter. The second emitter of the diode is electrically connected to a second terminal 42. The second terminal 42 is a cathode terminal if the second emitter is an n-emitter.

Figure 8:
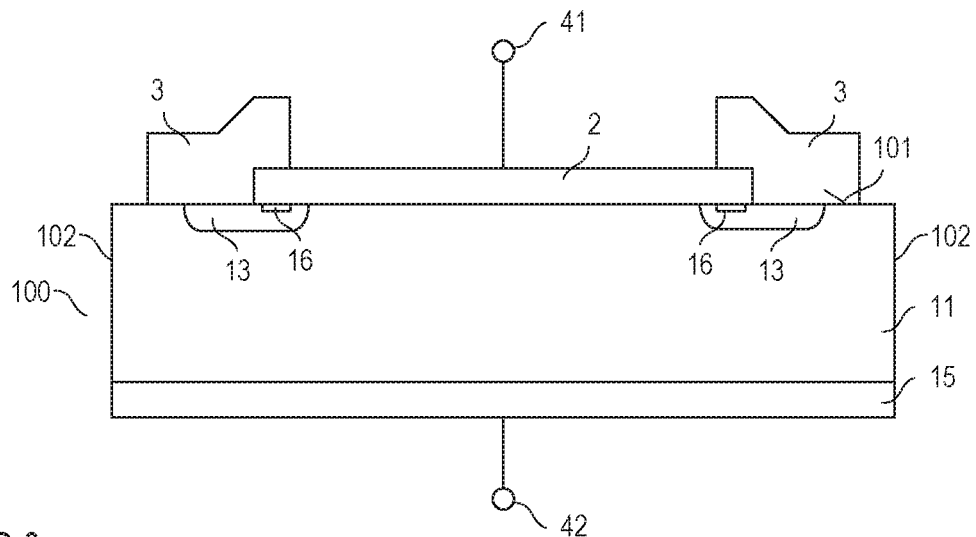
FIG. 8 illustrates a vertical cross sectional view of a semiconductor device implemented as a Schottky diode.

According to another embodiment shown in FIG. 8, the semiconductor device is implemented as a Schottky diode. The device topology of the Schottky diode substantially corresponds to the device topology of the bipolar diode with the difference that the first emitter 12 is omitted, the contact electrode 2 includes a Schottky metal and contacts the base region 11. Examples of a Schottky metal include titanium (Ti), titanium nitride, molybdenum (Mo), and molybdenum nitride. According to one embodiment, the contact electrode 2 includes two sublayers 21, 22 as shown in FIG. 2, from which at least the first sublayer 21 that contacts the base region 11 includes a Schottky metal. The second sublayer may include aluminum, copper, or an alloy of at least one of aluminum and copper.

Referring to FIG. 8, the JTE region 13 of the second doping type complementary to the doping type of the base region 11 may extend to below the contact electrode and be electrically connected to the contact electrode. According to one embodiment, a contact region 16 of the second doping type and more highly doped than the JTE region 13 provides for an ohmic contact between the contact electrode 2 and the JTE region 13.

Figure 9:
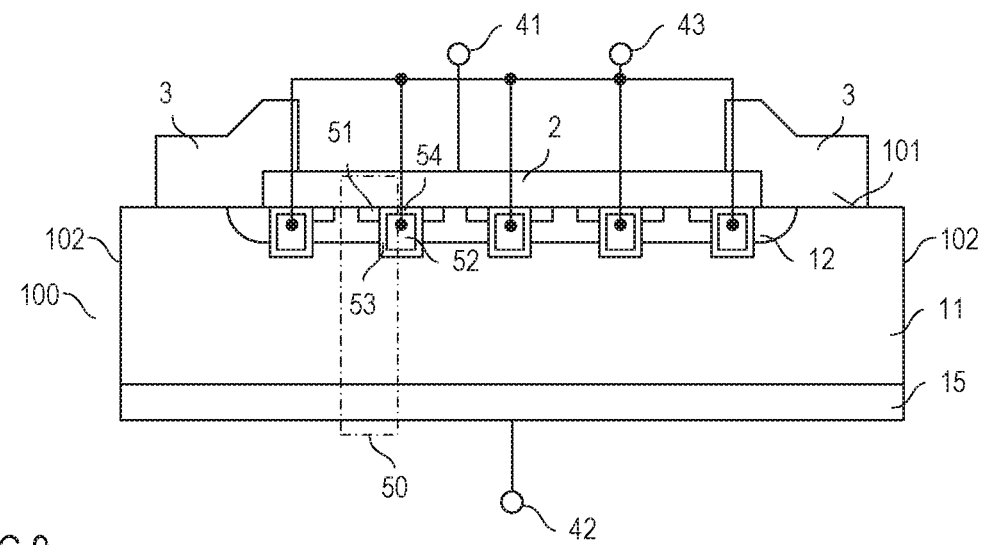
FIG. 9 illustrates a vertical cross sectional view of a semiconductor device implemented as an MOS transistor.

FIG. 9 illustrates a vertical cross sectional view of one embodiment of an MOS transistor. In this MOS transistor the first device region 11 is a drift region and the second device region 12 is a body region. The MOS transistor includes a plurality of transistor cells 50. Each transistor cell includes a source region 51 separated from the drift region 11 by the body region 12, a gate electrode 52 and a gate dielectric 53 dielectrically insulating the gate electrode 52 from the source region 51, the body region 12 and the drift region 11. The individual transistor cells 50 share the drift region 11 and the drain region 14. The gate electrodes 52 are electrically connected to a gate electrode 43 and electrically insulated from the contact electrode by insulation layers 54. The contact electrode 2 forms a source electrode, is connected to the source and body regions 51, 52, and is connected to the first terminal 41 that forms a source terminal. The drain region 14 is connected to a second terminal 42 that forms the drain terminal.

The MOS transistor can be implemented as a MOSFET. In this case, the drain region 14 has the same doping type as the drift region 11, but is more highly doped. Alternatively, the MOS transistor is implemented as an IGBT. In this case, the drain region 14 is doped complementarily to the drift region 11. The MOS transistor can be implemented as an n-type or as a p-type transistor. In an n-type transistor the drift region 11 and the source regions 51 are n-doped, while the body region 12 is p-doped. In a p-type transistor, the drift region 11 and the source regions 51 are p-doped, while the body region 12 is n-doped.

Figure 10:
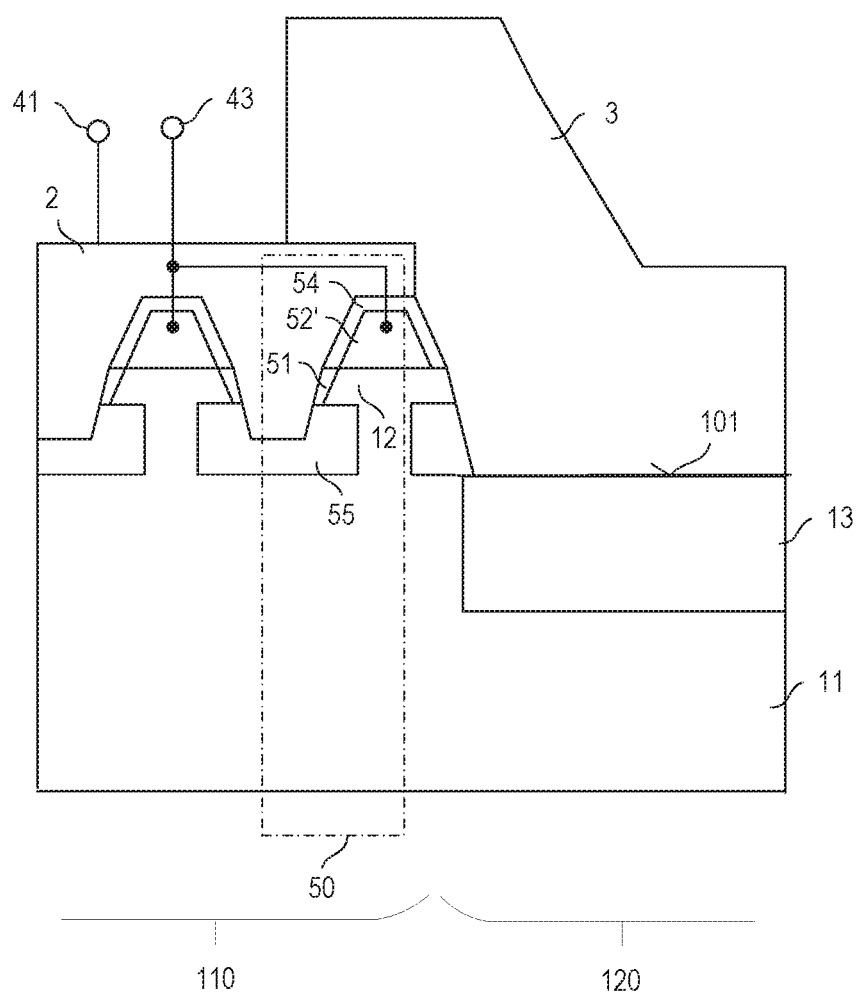
FIG. 10 illustrates a vertical cross sectional view of a semiconductor device implemented as a JFET.

FIG. 10 shows a vertical cross sectional view of one embodiment of a JFET (Junction Field-Effect Transistor). FIG. 10 shows one section which includes a section of the inner region 110 and a section of the edge region 120 in the region of the first surface 101. The JFET is different from the MOS transistor explained with reference to FIG. 9 in that the source region 51, the body region 12, the drift region 11, and the drain region (not shown in FIG. 10) have the same doping type, which is n-type in an n-JFET and p-type in a p-JFET. Further, instead of a gate electrode, the JFET includes a doped gate region of a doping type complementary to the doping type of the body region 12. The gate region 52' adjoins the body region 12 and forms a pn-junction therewith. The contact electrode 2 is electrically connected to the source region 51 and electrically insulated from the gate region 52' by an insulation layer 54. The contact electrode 2 forms a source electrode of the JFET and is connected to a source terminal, and the gate region 52' is electrically connected to a gate terminal 43. Like the MOS transistor, the JFET may include a plurality of transistor cells 50 that each include a source region 51, a body region 12, and a gate region 52', and that share the drift region 11 and the drain region.

The JFET can be switched off by applying a drive potential to the gate region 52' such that a depletion region expands into the body region 12 from the pn junction between the body region 12 and the gate region 52' and depletes the body region so as to interrupt a conducting channel between the source region 52 and the drift region 11. As shown, the body region 12 may be located between the gate region 52' and a doped region of the same doping type as the gate region 52' and electrically connected to the contact electrode (source electrode) 2. Alternatively (not shown), the body region 12 is located between two adjacent gate regions.

The device structure explained with reference to FIGS. 1-5 is not restricted to be used in a bipolar diode, a Schottky diode, a MOS transistor, or a JFET but may be implemented in other types of semiconductor devices such as, for example, BJTs (Bipolar Junction Transistors) as well.

Figure 11A:
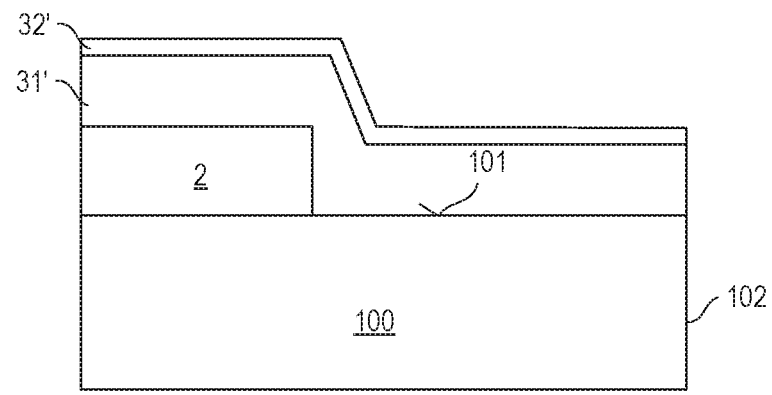
FIGS. 11A-11C illustrate one embodiment of a method for producing a semiconductor device with a passivation layer.
Figure 11B:
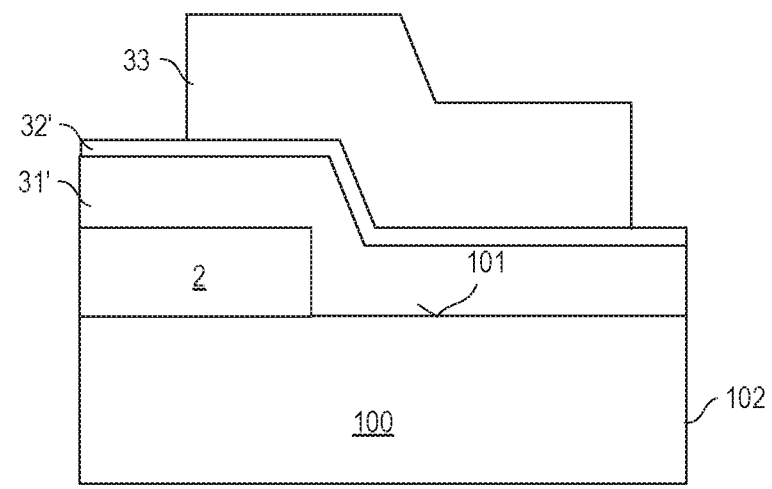
Figure 11C:
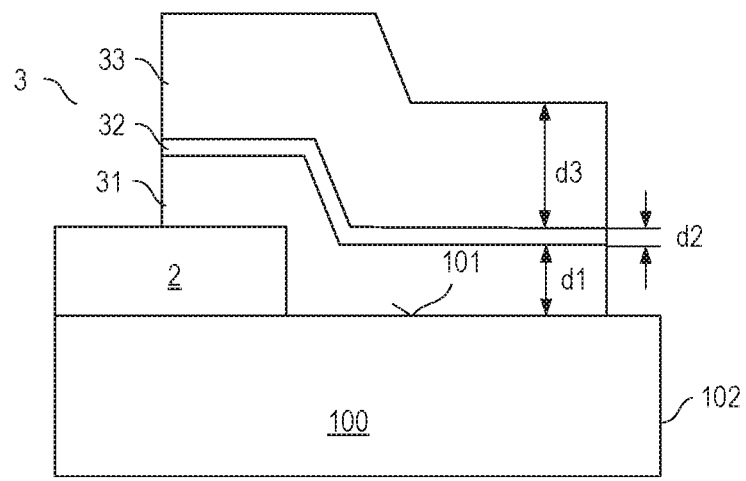

FIGS. 11A-11C illustrate a first embodiment of a method for producing a device topology as explained with reference to FIGS. 1 and 2 herein before. FIGS. 9A-9C schematically illustrates vertical cross sectional views of the semiconductor body 100 at different stages of the manufacturing process.

Referring to FIG. 11A, the method includes forming a first precursor layer 31' on the contact electrode 2 and those sections of the first surface 101 not covered by the contact electrode 2. The first precursor layer 31' may completely cover the contact electrode 2 and those sections of the first surface 101 not covered by the contact electrode 2. After an etching process that is explained with reference to FIGS. 11B and 11C the first precursor layer 31' forms the first layer 31. According to embodiment, forming the first precursor layer 31' includes a PECVD process. Alternatively, forming the first precursor layer 31' includes a sputter process. As stated above, the first layer 31 may include two or more sublayers with different material compositions. Thus, the first precursor layer 31' may include two or more sublayers with different material compositions. Those sublayers may be produced one above the other.

Before forming the first precursor layer 31', a surface of the contact electrode 2 and/or the first surface 101 of the semiconductor body 100 may be roughened by, for example, sputtering in order to improve the adhesion of the first layer to the contact electrode 2 and the first surface, respectively.

Referring to FIG. 11A, the method further includes forming a second precursor layer 32' on the first precursor layer 31'. The second precursor layer 32' may completely cover the first precursor layer 31'. According to one embodiment, forming the second precursor layer 32' includes a PECVD process. Alternatively, forming the second precursor layer 32' includes a sputter process.

Referring to FIG. 11B, the method further includes forming the third layer 33 on the second precursor layer 32'. Forming the third layer 33 may include forming a third precursor layer (not shown) that completely covers the second precursor layer 32' and patterning the third precursor layer to form the third layer 33. Patterning the third precursor layer may include a photolithography process in which the third precursor layer (like a conventional photoresist) is exposed using a lithography mask, and developed. Further, exposed or non-exposed sections (depending on the type of development) are removed so as to form the third layer 33.

The third layer 33 is used as an etch mask for etching the first and second precursor layers 31', 32' so as to form the first and second layers. The result of this etching process is shown in FIG. 11C.

The third precursor layer (not shown in FIG. 11B) may be a non-cured imide layer that can be patterned as explained before. After patterning the third precursor layer and before using the third layer 33 as an etch mask for etching the first and second precursor layers 31', 32', the third layer 33 is cured according to one embodiment. Curing makes the third layer 33 hard and robust enough to act as the etch mask. Curing may include an annealing process at temperatures between 300'C and 400° C.

After the process explained with reference to FIGS. 11A-11C, edges of the first layer 31, the second layer 32, and the third layer 33 are aligned. One embodiment of a process that produces edges of the third layer to be distant to edges of the second layer 32 is explained with reference to FIGS. 12A-12B below.

Figure 12A:
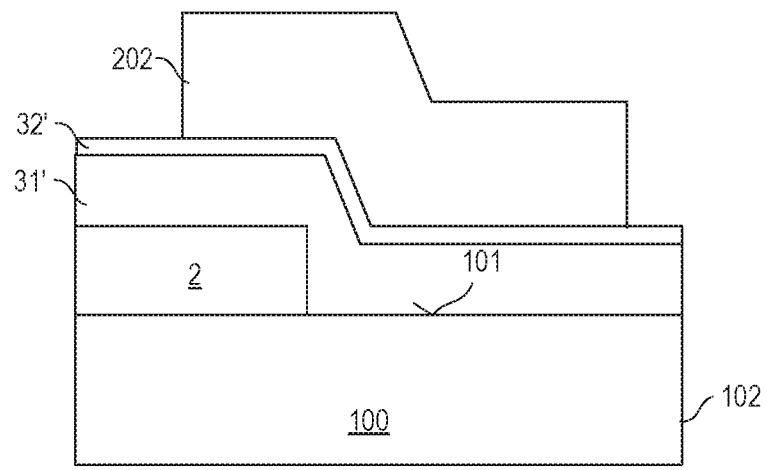
FIGS. 12A-12B illustrate another embodiment of a method for producing a semiconductor device with a passivation layer.

This process is different from the process explained with reference to FIGS. 11A-11C in that patterning the first and second precursor layers 31', 32' in order to form the first and second layers 31, 32 involves an etch mask 202 that is completely removed after forming the first and second layers 31, 32. This etch mask is shown in FIG. 12A.

Figure 12B:
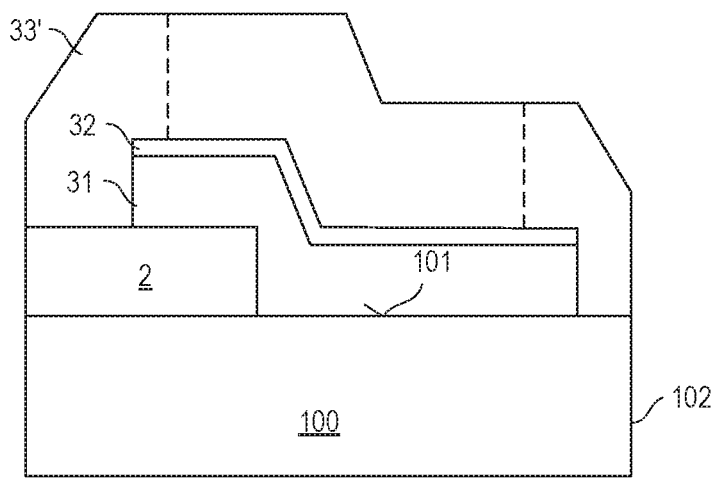

Referring to FIG. 12B, after removing the etch mask 202, the third precursor layer 33' is formed on the second layer 32 and those sections of the contact electrode 2 and the first surface 101 not covered by the first and second layers 31, 32. According to one embodiment, the third precursor layer 33' is a non-cured imide layer. The method further includes patterning the third precursor layer 33'. Patterning the third precursor layer 33' may include a lithography process as explained before with reference to FIG. 11B. By virtue of this process, the third precursor layer 33' can be patterned independent of the first and second layers 31, 32 so that the third layer 33 is produced to have inner and outer edges that are distant to inner and outer edges of the second layer 32, as explained with reference to FIG. 4. The third layer 33 may be cured after the lithography process that patterns the third precursor layer 33'.

Referring to FIG. 5, the method may further include forming the housing 62 and filling a space in the housing 62 with the soft encapsulation layer 61.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a semiconductor body comprising a first surface and an edge surface laterally terminating the first surface;
a contact electrode formed on the first surface and comprising an outer edge side that faces and is laterally spaced apart from the edge surface; and
a passivation layer section conformally covering the outer edge side of the contact electrode,
wherein the passivation layer section is a multi-layer stack comprising a first layer, a second layer, and a third layer, each of the first, second and third layers being formed from different electrically insulating materials,
wherein the first layer directly contacts the contact electrode and the first surface,
wherein the second layer is formed directly on the first layer,
wherein the third layer is formed directly on the second layer,
wherein each of the first, second and third layers comprise outer edge sides facing the edge surface of the semiconductor body and inner edge sides opposite from the outer edge sides,
wherein the outer edge side of the contact electrode extends along a first plane that is transverse to the first surface and wherein the first plane is disposed laterally between the inner edge sides and the outer edge sides of each of the first, second and third layers,
wherein the inner edge side of the third layer is laterally closer to the first plane than the inner edge side of the second layer is to the first plane, and
wherein the outer edge side of the third layer is laterally closer to the first plane than the outer edge side of the second layer is to the first plane.

2. The semiconductor device of claim 1,
wherein the edge surface of the semiconductor body extends along a second plane that is transverse to the first surface,
wherein the outer edge sides of each of the first, second and third layers are disposed laterally between the first plane and the second plane.

3. The semiconductor device of claim 1,
wherein inner edge sides of the first and second layers are laterally aligned with one another, and
wherein the outer edge sides of the first and second layers are laterally aligned with one another.

4. The semiconductor device of claim 1,
wherein the outer edge side of the contact electrode forms a complete loop that is laterally spaced apart from the edge surface of the semiconductor body in every direction,
wherein the passivation layer section conformally covers the outer edge side of the contact electrode around the complete loop,
wherein the inner edge sides of the first, second and third layers are laterally spaced apart from the first plane around the complete loop, and
wherein the outer edge sides of the first, second and third layers are laterally spaced apart from the outer edge side of the contact electrode around the complete loop.

5. The semiconductor device of claim 1, further comprising:
a first doped region and a second doped region in the semiconductor body,
wherein the first doped region and the second doped region form a pn junction with one another,
wherein the pn junction extends to the first surface,
wherein the contact electrode is connected to the second doped region, and
wherein the passivation layer covers the pn junction on top of the first surface.

6. The semiconductor device of claim 1, wherein the first layer comprises at least one of: USG, PSG, BSG, and BPSG.

7. The semiconductor device of claim 1, wherein the second layer comprises a nitride.

8. The semiconductor device of claim 1, wherein the third layer comprises an imide.

9. The semiconductor device of claim 1, wherein the first layer comprises at least one of: USG, PSG, BSG, and BPSG, wherein the second layer comprises a nitride, and wherein the third layer comprises an imide.

10. The semiconductor device of claim 1, wherein the semiconductor body comprises at least one of silicon (Si), silicon carbide (SiC), gallium arsenide (GaAs), gallium nitride (GaN), gallium phosphide (GaP), indium phosphide (InP), indium gallium nitride (InGaN), indium gallium arsenide (InGaAs), cadmium telluride (CdTe), cadmium mercury telluride (CdHgTe), and cadmium magnesium telluride (CdMgTe).

11. The semiconductor device of claim 10, wherein the semiconductor body comprises silicon carbide (SiC).

12. The semiconductor device of claim 1,
wherein a thickness of the first layer is at least 1.5 micrometers, and
wherein a thickness of the second layer is at least 0.6 micrometers.

13. The semiconductor device of claim 1, further comprising:
a soft encapsulation layer on the third layer and the contact electrode; and
a housing separated from the third layer by the soft encapsulation layer.

14. The semiconductor device of claim 13, wherein the soft encapsulation layer is selected from the group consisting of:
silicone, and
silica gel.

15. A method of forming a semiconductor device, comprising:
providing a semiconductor body comprising a first surface and an edge surface laterally terminating the first surface;
forming a contact electrode on the first surface that comprises an outer edge side that faces and is laterally spaced apart from the edge surface; and
forming a passivation layer section that conformally covers the outer edge side of the contact electrode,
wherein the passivation layer section is a multi-layer stack comprising a first layer, a second layer, and a third layer, each of the first, second and third layers being formed from different electrically insulating materials,
wherein the first layer directly contacts the contact electrode and the first surface,
wherein the second layer is formed directly on the first layer,
wherein the third layer is formed directly on the second layer,
wherein each of the first, second and third layers comprise outer edge sides facing the edge surface of the semiconductor body and inner edge sides opposite from the outer edge sides,
wherein the outer edge side of the contact electrode extends along a first plane that is transverse to the first surface and wherein the first plane is disposed laterally between the inner edge sides and the outer edge sides of each of the first, second and third layers,
wherein the inner edge side of the third layer is laterally closer to the first plane than the inner edge side of the second layer is to the first plane, and
wherein the outer edge side of the third layer is laterally closer to the first plane than the outer edge side of the second layer is to the first plane.

16. The method of claim 15,
wherein the edge surface of the semiconductor body extends along a second plane that is transverse to the first surface,
wherein the outer edge sides of each of the first, second and third layers are disposed laterally between the first plane and the second plane.

17. The method of claim 15,
wherein inner edge sides of the first and second layers are laterally aligned with one another, and
wherein the outer edge sides of the first and second layers are laterally aligned with one another.

18. The method of claim 15,
wherein the outer edge side of the contact electrode forms a complete loop that is laterally spaced apart from the edge surface of the semiconductor body in every direction,
wherein the passivation layer section conformally covers the outer edge side of the contact electrode around the complete loop,
wherein the inner edge sides of the first, second and third layers are laterally spaced apart from the first plane around the complete loop, and
wherein the outer edge sides of the first, second and third layers are laterally spaced apart from the outer edge side of the contact electrode around the complete loop.

19. The method of claim 15, wherein forming the passivation layer section comprises patterning the first layer and the second layer in an etching process using the third layer as an etch mask.

20. The method of claim 15, wherein forming the passivation layer section comprises patterning the first layer and the second layer in an etching process using a first etch mask, removing the first etch mask, depositing a precursor layer and patterning the precursor layer to form the third layer.

* * * * *